(12) United States Patent
Joe et al.

(10) Patent No.: US 7,839,694 B2
(45) Date of Patent: Nov. 23, 2010

(54) NONVOLATILE MEMORY DEVICES AND DATA READING METHODS

(75) Inventors: In-sung Joe, Seoul (KR); Young-gu Jin, Hwaseong-si-si (KR); Jae-woong Hyun, Uijeongbu-si-si (KR); Yoon-dong Park, Yongin-si-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 141 days.

(21) Appl. No.: 12/076,706

(22) Filed: Mar. 21, 2008

(65) Prior Publication Data

US 2009/0052239 A1 Feb. 26, 2009

(30) Foreign Application Priority Data

Aug. 20, 2007 (KR) ............. 10-2007-0083447

(51) Int. Cl.
*G11C 16/06* (2006.01)
(52) U.S. Cl. .............. 365/185.23; 365/185.18; 365/185.26; 365/189.09
(58) Field of Classification Search ............ 365/185.23, 365/185.18, 185.26, 189.09
See application file for complete search history.

(56) References Cited

U.S. PATENT DOCUMENTS

| | | | | |
|---|---|---|---|---|
| 6,134,140 A * | 10/2000 | Tanaka et al. | ........... | 365/185.03 |
| 6,504,757 B1 * | 1/2003 | Hollmer et al. | ......... | 365/185.18 |
| 6,754,099 B2 * | 6/2004 | Hidaka | ......................... | 365/173 |
| 7,079,437 B2 * | 7/2006 | Hazama et al. | ........ | 365/210.12 |
| 7,239,556 B2 * | 7/2007 | Abe et al. | .............. | 365/185.33 |
| 7,272,049 B2 * | 9/2007 | Kang et al. | ............... | 365/185.2 |
| 7,301,815 B2 * | 11/2007 | Kurata et al. | ............. | 365/185.2 |
| 7,310,280 B2 * | 12/2007 | Park et al. | ................. | 365/210.1 |
| 7,391,078 B2 * | 6/2008 | Wong et al. | .................. | 257/330 |
| 7,440,322 B2 * | 10/2008 | Kamei | .................... | 365/185.17 |
| 7,486,554 B2 * | 2/2009 | Park et al. | .............. | 365/185.02 |
| 7,518,911 B2 * | 4/2009 | Kamei | .................... | 365/185.03 |
| 7,518,920 B2 * | 4/2009 | Kang | .................... | 365/185.17 |
| 7,535,758 B2 * | 5/2009 | Bergemont et al. | ..... | 365/185.01 |
| 7,570,517 B2 * | 8/2009 | Kwak et al. | ............ | 365/185.17 |
| 7,630,261 B2 * | 12/2009 | Abe et al. | .............. | 365/185.17 |
| 7,652,926 B2 * | 1/2010 | Kang et al. | ............... | 365/185.2 |
| 7,652,931 B2 * | 1/2010 | Park et al. | .............. | 365/185.29 |
| 2007/0002632 A1 * | 1/2007 | Okayama et al. | ........ | 365/185.24 |

* cited by examiner

*Primary Examiner*—Viet Q Nguyen
(74) *Attorney, Agent, or Firm*—Harness, Dickey & Pierce, P.L.C.

(57) ABSTRACT

Methods of reading memory cell data and nonvolatile memory devices, which apply a low voltage to memory cells adjacent to a memory cell from which data may be read are provided. Methods of reading memory cell data of nonvolatile memory device include applying a first voltage to a control gate of a read memory cell from among the plurality of memory cells, applying a third voltage to control gates of memory cell adjacent to the read memory cell, and applying a second voltage to control gates of memory cells other than the read memory cell and the adjacent memory cells.

21 Claims, 8 Drawing Sheets

NONVOLATILE MEMORY DEVICES AND DATA READING METHODS

PRIORITY STATEMENT

This application claims the benefit of Korean Patent Application No. 10-2007-0083447, filed on Aug. 20, 2007, in the Korean Intellectual Property Office, the disclosure of which is hereby incorporated by reference in its entirety.

BACKGROUND

1. Field

Example embodiments provide methods of reading memory cell data and nonvolatile memory devices, which may apply a low voltage to memory cells adjacent to a memory cell from which data may be read.

2. Description of the Related Art

Nonvolatile memory devices capable of electrically erasing and programming data may preserve data even when power is not supplied. Flash memory is an example of a nonvolatile memory device that stores data using charge storage. The memory cells of a flash memory may be, for example, cell transistors including a control gate, a charge storage layer, a source and a drain.

Flash memory controls the quantity of charges of the charge storage layers, to change data values written to the memory cells. Data of the cell transistor may be erased by applying a ground voltage to the control gate of the cell transistor and supplying a voltage higher than a power supply voltage to a semiconductor substrate and/or bulk. In the erase bias condition and/or state, a strong electric field may be formed between the charge storage layer and the bulk due to a large voltage difference between the charge storage layer and the bulk. The charges in the charge storage layer may be discharged to the bulk according to F-N (Fowler-Nordheim) tunneling and a threshold voltage of the erased cell transistor may therefore be decreased.

A cell transistor programming operation may be performed by, e.g. applying a voltage higher than a power supply voltage to the control gate of the cell transistor and applying a ground voltage to the drain and the bulk of the cell transistor. Under a bias condition, charges may be injected into the charge storage layer of the cell transistor by e.g. F-N tunneling, and the threshold voltage of the cell transistor may therefore be increased.

In an erase state the threshold voltage of the cell transistor is negative because the charge storage layer has negative charges and in a programmed state the threshold voltage of the cell transistor is higher than 0 because charges may be injected into the charge storage layer.

SUMMARY

Example embodiments provide memory cell data reading methods that apply a low voltage to memory cells adjacent to a memory cell from which data may be read. Example embodiments also provide nonvolatile memory devices that apply a low voltage to memory cells adjacent to a memory cell from which data may be read. Example embodiments provide methods and device by which one may be able to confirm whether a memory cell from which data is read (referred to as a read memory cell hereinafter) may be in an erase state or in a programmed state.

Example embodiments, may provide methods of reading memory cell data of nonvolatile memory devices, including a plurality of memory cells each having a control gate and a charge storage layer. The method includes applying a first voltage to a control gate of a read memory cell from among the plurality of memory cells, applying a third voltage to control gates of memory cells adjacent to the read memory cell, and applying a second voltage to control gates of memory cells other than the read memory cell and the adjacent memory cells. The third voltage may be higher than the first voltage and lower than the second voltage. The second voltage may be higher than or equal to a minimum voltage and make current flow through the memory cells irrespective of states of the memory cells.

Example embodiments also provide that the third voltage may be lower than a voltage that changes a state of the read memory cell and current flow through the adjacent memory cells may be based on at least the applied second and third voltages. The first voltage may be higher than a threshold voltage of a memory cell in an erase state and lower than a threshold voltage of a memory cell in a programmed state. The second voltage may be higher than the threshold voltage of the memory cell in the programmed state. The third voltage may decrease as the gate length of the control gates of the memory cells decreases. Example embodiments also provide that a fourth voltage may be higher than the third voltage and lower than the second voltage. The memory cells may be NAND flash memory cells.

BRIEF DESCRIPTION OF THE DRAWINGS

Example embodiments will be more clearly understood from the following detailed description taken in conjunction with the accompanying drawings. FIGS. 1-7 represent non-limiting, example embodiments as described herein.

FIG. 1 illustrates an operation of applying voltages to memory cells in a method of reading memory cell data according to example embodiments;

FIG. 2 illustrates an operation of applying voltages to memory cells in a method of reading memory cell data, according to example embodiments;

FIG. 5 illustrates an operation of applying voltages to memory cells in a method of reading memory cell data according to example embodiments;

FIG. 6 illustrates an operation of applying voltages to memory cells in a method of reading memory cell data according to example embodiments; and FIG. 7 illustrates example embodiments of nonvolatile memory devices having vertical channels to which the methods of reading memory cell data may be applied.

DETAILED DESCRIPTION OF EXAMPLE EMBODIMENTS

Figure 1:
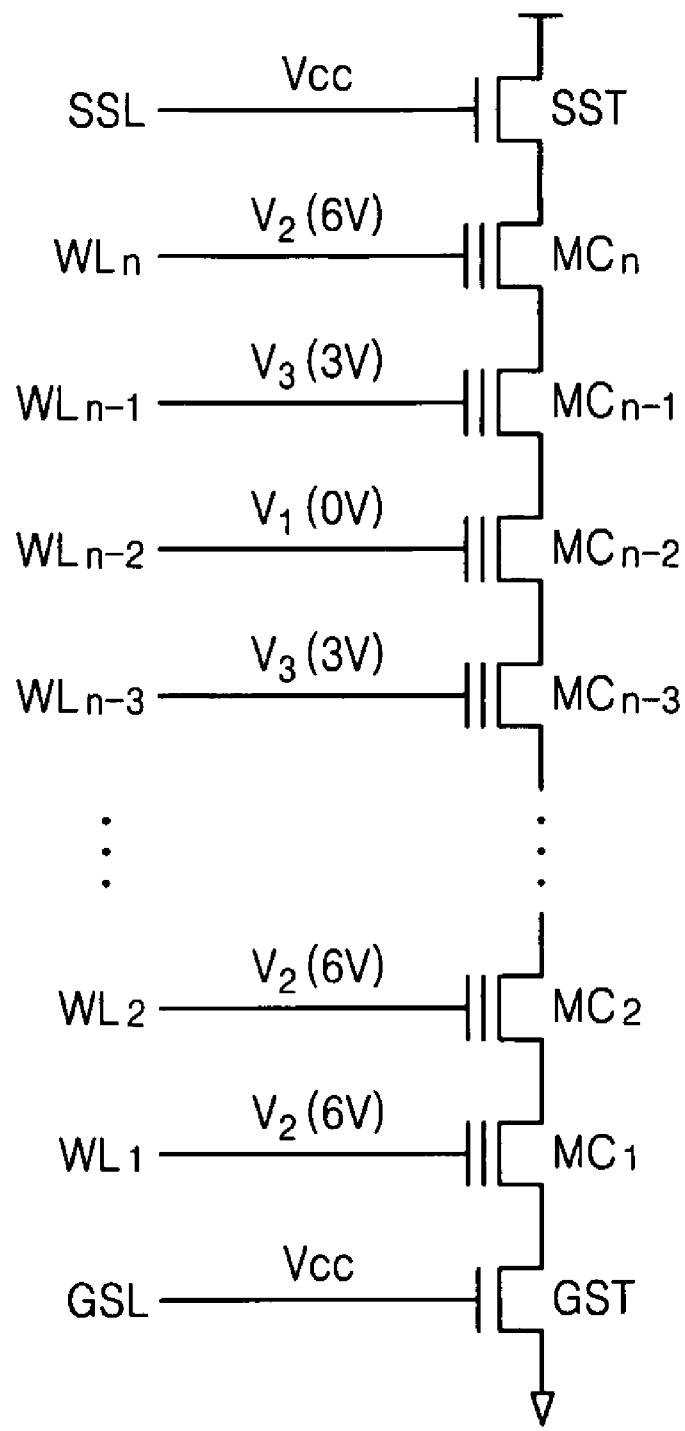

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

In FIGS. 1 through 6, first, second, third and fourth voltages V1, V2, V3 and V4, may for example, respectively correspond to 0V, 6V, 3V and/or 2V and 4.5V. However, it will be understood by those of ordinary skill in the art that the first, second, third and fourth voltages V1, V2, V3 and V4 may have various different values based on e.g. design requirements.

FIG. 1 illustrates an operation of applying voltages to memory cells in a method of reading memory cell data according to example embodiments. Referring to FIG. 1, the method illustrated applies a first voltage V1 to a control gate of a read memory cell MCn-2, applies a third voltage V3 to control gates of adjacent memory cells MCn-3 and MCn-1 (adjacent being, e.g. directly next to the read memory cell MCn-2), and applies a second voltage V2 to other memory cells MC1 through MCn-4 (not shown) and MCn (other being, e.g. other than the read memory cell MCn-2 and the adjacent memory cells MCn-3 and MCn-1).

The first voltage V1 may be applied to the control gate of the read memory cell MCn-2 and may be higher than a threshold voltage of a memory cell in an erase state and lower than a threshold voltage of a memory cell in a programmed state. For example, if read memory cell MCn-2 is in an erase state, the first voltage V1 may be higher than a threshold voltage of read memory cell MCn-2. If the first voltage V1 is applied to read memory cell MCn-2 in an erase state, read memory cell MCn-2 may be turned on, for example, current may flow through the read memory cell MCn-2. If read memory cell MCn-2 is in a programmed state, the first voltage V1 may be lower than the threshold voltage of read memory cell MCn-2 and when applied, the read memory cell MCn-2 may be turned off, e.g. current may not flow through read memory cell MCn-2. One may confirm whether read memory cell MCn-2 is in an erase state or in a programmed state by applying the first voltage V1 to read memory cell MCn-2 and measuring the current flowing through read memory cell MCn-2.

The second voltage applied to the control gates of the other memory cells MC1, MC2, . . . , MCn may be a minimum voltage that causes current flow through the memory cells MC1, MC2, . . . , MCn irrespective of the state of memory cells MC1, MC2, . . . , MCn. The second voltage V2 causes current flow through memory cells MC1, MC2, . . . , MCn irrespective of whether the memory cells MC1, MC2, . . . , MCn are in an erase state or in a programmed state. The second voltage V2 may be higher than the threshold voltages of memory cells MC1, MC2, . . . , MCn regardless of whether the memory cells MC1, MC2, . . . , MCn are in an erase state or in a programmed state. Therefore, when the second voltage V2 is applied to the control gates of memory cells MC1, MC2, . . . , MCn, the memory cells MC1, MC2, . . . , MCn may be turned on, and thus current may flow through the memory cells MC1, MC2, . . . , MCn.

The second voltage V2 may be higher than a minimum voltage by a predetermined or given level. For example, when the minimum voltage is 5.8V, a voltage margin of 0.2V may be given to set the second voltage V2 to 6.0V. Otherwise, the second voltage V2 may be set to 5.8V corresponding to the minimum voltage.

The second voltage V2 may be higher than a minimum voltage that allows current to flow through memory cells MC1, MC2, . . . , MCn and the second voltage V2 may correspond to the lowest voltage among voltages generated by the nonvolatile memory device including memory cells MC1 through MCn. For example, when the minimum voltage is 5.8V and the nonvolatile memory device generates voltages at intervals of 0.5V, the second voltage V2 may be 6.0V.

The second voltage V2 may be higher than a voltage range selected from a of a highest threshold voltage distribution to which a threshold voltage of a programmed memory may belong. The second voltage V2 may be higher than the highest threshold voltage by a predetermined voltage margin.

When the second voltage V2 is applied to the other memory cells MC1 through MC-4 (not shown) and MCn, to turn on memory cells MC1 through MCn-4 and MCn, and the first voltage V1 is applied to the read memory cell MCn-2, current does not flow through memory cells MC1 through MCn if the read memory cell MCn-2 is in an erase state and current does flow through memory cells MC1 through MCn if the read memory cell MCn-2 is in a programmed state. The state of read memory cell MCn-2 may be confirmed by detecting whether current flows through memory cells MC1 through MCn after applying the first voltage V1 to the read memory cell MCn-1 and the second voltage V2 to memory cells MC1 through MCn-4 and MCn. If current does flow, read memory cell MCn-2 is in a programmed state and if current does not flow, read memory cell MCn-2 is in an erase state.

When a voltage is applied to the control gates of adjacent memory cells MCn-3 and MCn-1, e.g. the third voltage V3, the applied voltage may affect the channel of the read memory cell MCn-2. As the applied voltage increases, the influence of the voltage on the channel of the read memory cell MCn-2 increases. In the memory cell data reading methods according to example embodiments, the third voltage V3 applied to the adjacent memory cells MCn-3 and MCn-1 may be lower than the second voltage V2 applied to the other memory cells MC1 through MCn-4 and MCn. The influence of the second voltage V2 on the channel of the read memory cell MCn-2 when the second voltage V2 is applied to the adjacent memory cells MCn-3 and MCn-1 may be less than the influence of the third voltage V3 on the channel of the read memory cell MCn-2 when the third voltage V3 is applied to the adjacent memory cells MCn-3 and MCnb-1.

Referring to FIG. 1, a plurality of memory cells MC1 through MCn may be connected between a string selection transistor SST and a ground selection transistor GST. A gate of the string selection transistor SST may be connected to a string selection line SSL. A gate of the ground selection transistor GST may be connected to a ground selection line GSL. The string selection transistor SST and the string selection transistor SST may be turned on or turned off based on a voltage Vcc.

Figure 2:
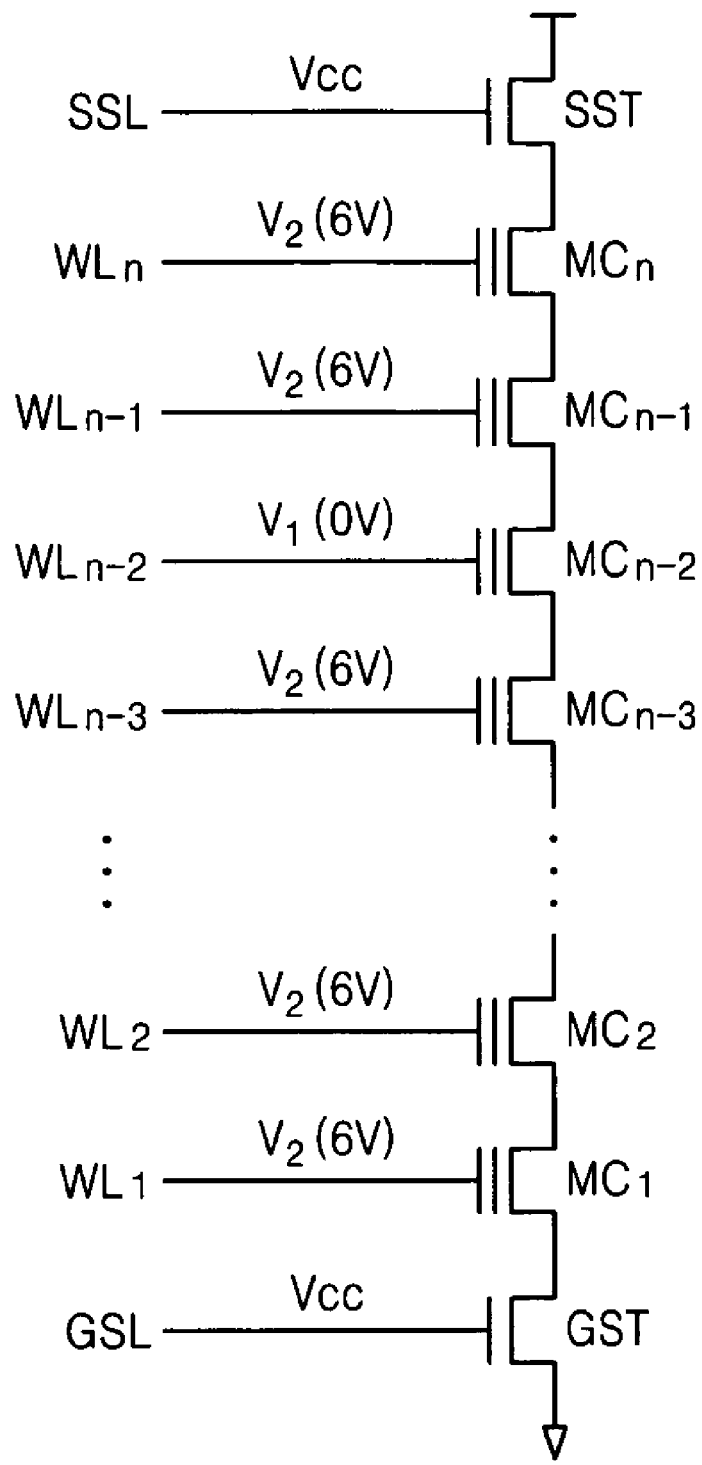

FIG. 2 illustrates an operation of applying voltages to memory cells in a method of reading memory cell data according to example embodiments. Referring to FIG. 2, the second voltage V2 may be applied to the other memory cells MC1 through MCn-3, MCn-1, and MCn. The second voltage V2 applied to the control gates of the memory cells MCn-3 and MCn-1 adjacent to the read memory cell MCn-2 affects the channel of the read memory cell MCn-2 based on the second voltage V2 being higher than the third voltage V3. Accordingly, the state of the read memory cell MCn-2 may not be confirmed, e.g. the read memory cell MCn-2 may be in an erase state or in a programmed state. However, when the third voltage V3 is lower than the second voltage V2 and applied to the adjacent memory cells MCn-3 and MCn-1 as illustrated in FIG. 1, the channel of the read memory cell MCn-2 may be less affected by the third voltage V3, and one may confirm whether the read memory cell MCn-2 is in an erase state or in a programmed state.

Figure 3A:
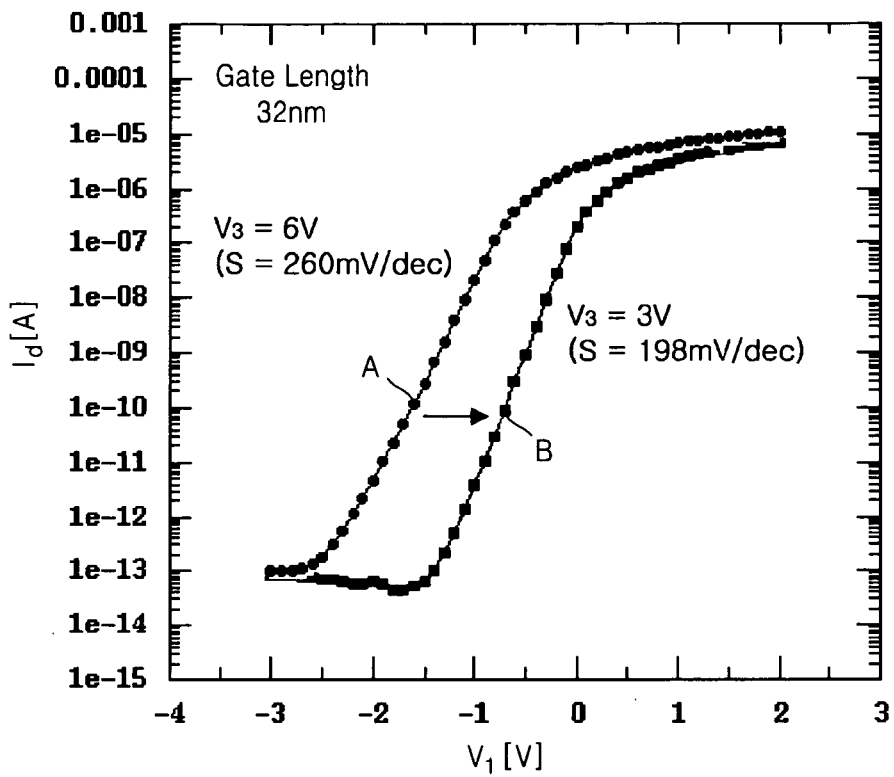
FIGS. 3A and 3B are graphs of voltage-current characteristics of read memory cells illustrated in FIGS. 1 and 2.

FIG. 3A is a graph of voltage-current characteristics of read memory cells illustrated in FIGS. 1 and 2. In FIG. 3A, curve A represents the voltage-current characteristic of the read memory cell illustrated in FIG. 2 and curve B represents the voltage-current characteristic of the read memory cell illustrated in FIG. 1. As shown by curve B, the voltage-current characteristic of the read memory cell illustrated in FIG. 1 may be normal when the third voltage V3 (e.g. 3V) is applied to the read memory cell. However, as shown by curve A, the voltage-current characteristic of the read memory cell illustrated in FIG. 2 may be abnormal when the second voltage V2 (e.g. 6V) is applied to the read memory cell. Accordingly, the state of the read memory cell may be confirmed when the third voltage V3 is applied to the read memory cell, while the state of the read memory cell may not be confirmed when the second voltage V2 is applied thereto.

Referring back to FIG. 1, the channel of one of the adjacent memory cells MCn-3 and MCn-1 may be affected by both the third voltage V3 and the second voltage V2 (e.g. applied to a neighboring memory cell e.g. MCn). Because the second voltage V2 may be higher than the third voltage V3 and the memory cell MCn-1 may be affected by both the second voltage V2 and the third voltage V3, the memory cell MCn-1 is turned on. The other neighboring memory cell MCn-3 also may be turned on by the affects of the second voltage V2 and the third voltage V3. Accordingly, a current path may be formed through memory cells MC1 through MCn and i.e. the state of the read memory cell MCn-2 may be confirmed.

Figure 4A:
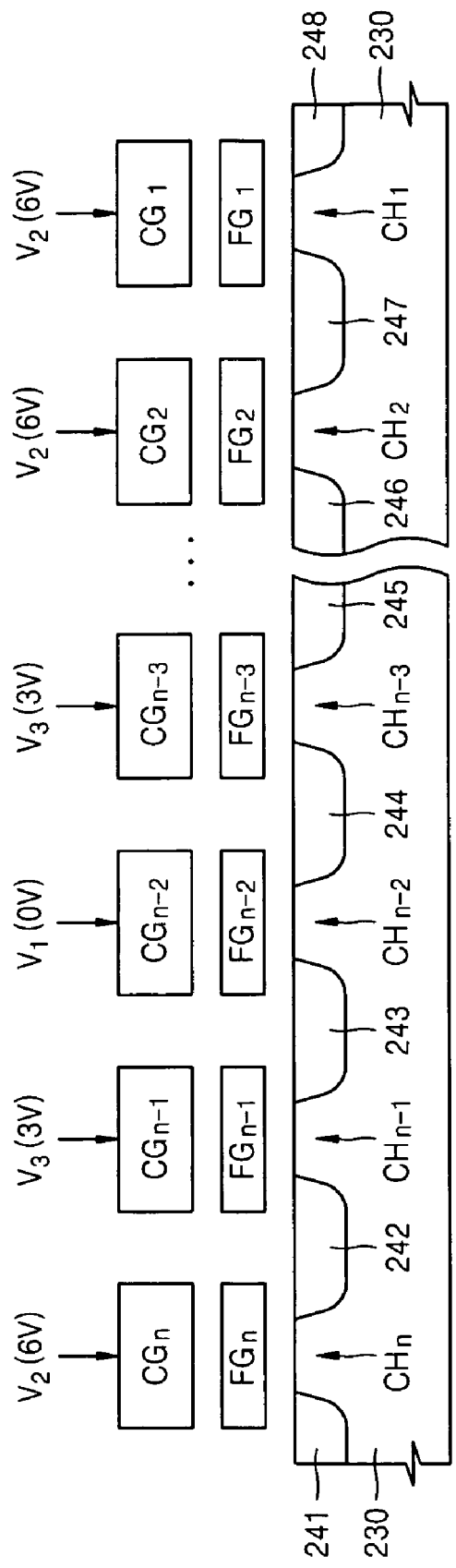
FIGS. 4A and 4B are cross-sectional views illustrating the operation of applying different voltages to memory cells adjacent to a read memory cell based on the lengths of memory cell control gates in a method of reading memory cell data according to example embodiments.
Figure 4B:
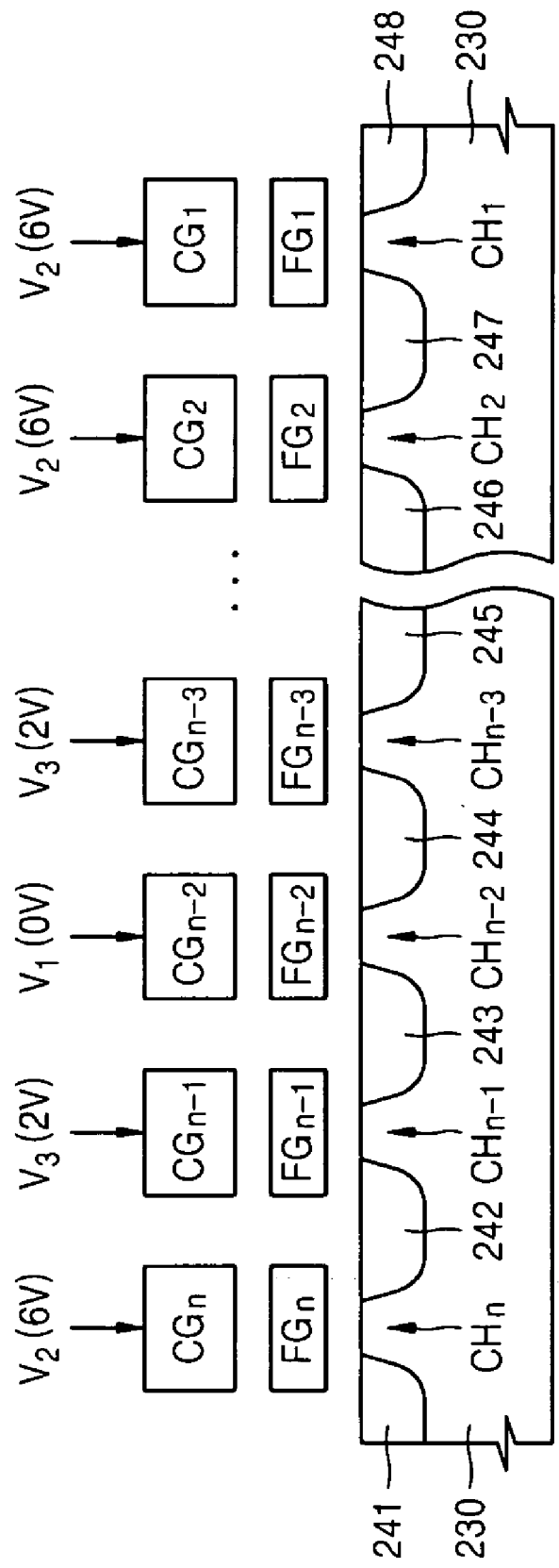

The methods of reading memory cell data according to example embodiments adjust the third voltage V3 when the gate length of the control gates of memory cells varies. FIGS. 4A and 4B are cross-sectional views illustrating an operation of applying different voltages to memory cells adjacent to a read memory cell according to the gate length of memory cell control gates in methods of reading memory cell data according to example embodiments.

Referring to FIGS. 1 and 4A, when the gate length of the control gates CG1 through CGn of memory cells MC1 through MCn is e.g. 32 nm, the third voltage V3 applied to adjacent memory cells MCn-1 and MCn-3 is e.g. 3V. Referring to FIGS. 1 and 4B, when the gate length of the control gates CG1 through CGn of memory cells MC1 through MCn is e.g. 24 nm, the third voltage V3 applied to adjacent memory cells MCn-1 and MCn-3 is e.g. 2V. It will be understood by those of ordinary skill in the art that the gate length of the control gates CG1 through CGn of the memory cells MC1 through MCn and the third voltage V3 may be varied according to design requirements.

For example, if the gate length of the control gate CGn-2 of memory cell MCn-2 is short (e.g. 24 nm), the voltage applied to the control gate CGn-2 of memory cell MCn-2 affects the channels CHn-3 and CHn-1 of adjacent memory cells MCn-3 and MCn-1. The voltage applied to the adjacent memory cells MCn-1 and MCn-3 also affects the read memory cell MCn-2. Accordingly, if the same voltage is applied to the adjacent memory cells MCn-3 and MCn-1 having control gates CG1 through CGn with a short gate length (e.g. 24 nm) and to the control gates CG1 through CGn having a long gate length (e.g. 32 nm), the influence of the voltage applied to the adjacent memory cells MCn-3 and MCn-1 with short gate length may be larger than the influence of the voltage applied to the adjacent memory cells MCn-3 and MCn-1 with a long gate length. A method of reading memory cell data according to example embodiments decreases the third voltage V3 applied to adjacent memory cells MCn-1 and MCn-3 when the control gates CG1 through CGn have a short gate length. Accordingly, the influence of the third voltage V3 on the channel of the read memory cell MCn-2 decreases.

Additionally, when the control gate CGn-2 of memory cell MCn-2, for example, has a short gate length, the influence of the second voltage V2 applied to the memory cell MCn on the channel CHn-1 of memory cell MCn-1 may increase. Accordingly, even when the third voltage V3 applied to the adjacent memory cell MCn-3 is decreased, the memory cell MCn-1 may be turned on by the second voltage V2 applied to the other memory cell MCn.

Figure 3B:
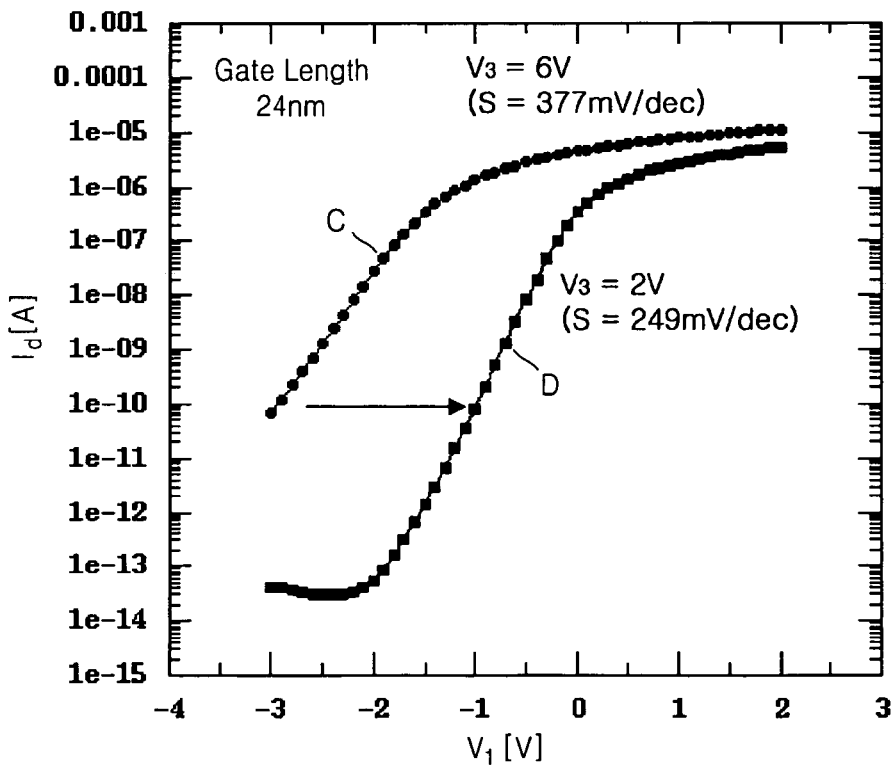

Referring back to FIG. 3A, the read memory cell MCn-2 shown by B has a normal current-voltage characteristic when a third voltage V3 of 3V is applied to adjacent memory cell MCn-1 when the gate length of control gate CGn-2 is 32 nm. Referring to FIG. 3B, the read memory cell MCn-2 shown by D has a normal current-voltage characteristic when a third voltage of 2V is applied to adjacent memory cell MCn-1 when the gate length of control gate CGn-2 is 24 nm.

Referring back to FIG. 1, the plurality of memory cells MC1 through MCn may be respectively connected to different wordlines WL1 through WLn and provided with the first voltage V1, the second voltage V2 and/or the third voltage V3 through wordlines WL1 through WLn. The plurality of memory cells MC1 through MCn may also be connected to the same bit line.

Figure 5:
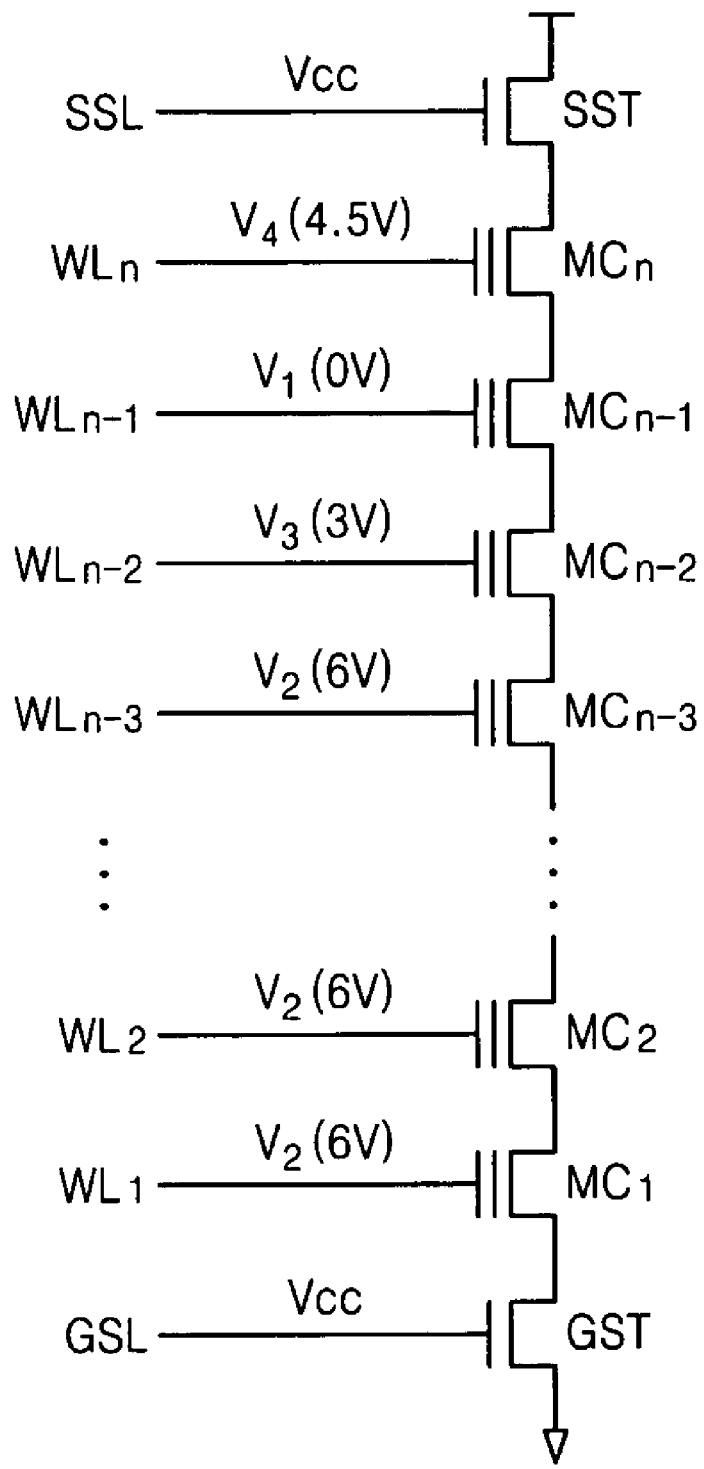

FIG. 5 illustrates an operation of applying voltages to memory cells in a method of reading memory cell data according to example embodiments. Referring to FIG. 5, when the memory cell MCn-1 is a read memory cell, a method of reading memory cell data according to example embodiments, applies to adjacent memory cell MCn on one side of the read memory cell MCn-1 a fourth voltage V4 higher than the third voltage V3 and lower than the second voltage V2 and applies to adjacent memory cell MCn-2 on the other side of the read memory cell MCn-1 the third voltage V3. The channel of the memory cell MCn-2 may be affected by both the second voltage V2 applied to memory cell MCn-3 and the third voltage V3 applied to memory cell MCn-2, which may turn on memory cell MCn-2. The channel of memory cell MCn may also be affected by the fourth voltage V4. Memory cell MCn may be turned on only with the fourth voltage V4 if the fourth voltage V4 is higher than the third voltage V3. If the memory cell MCn is a read memory cell, the third voltage V3 may be applied to memory cell MC3 and the fourth voltage V4 may be applied to memory cell MC1 turning on both memory cells MC1 and MC3.

Figure 6:
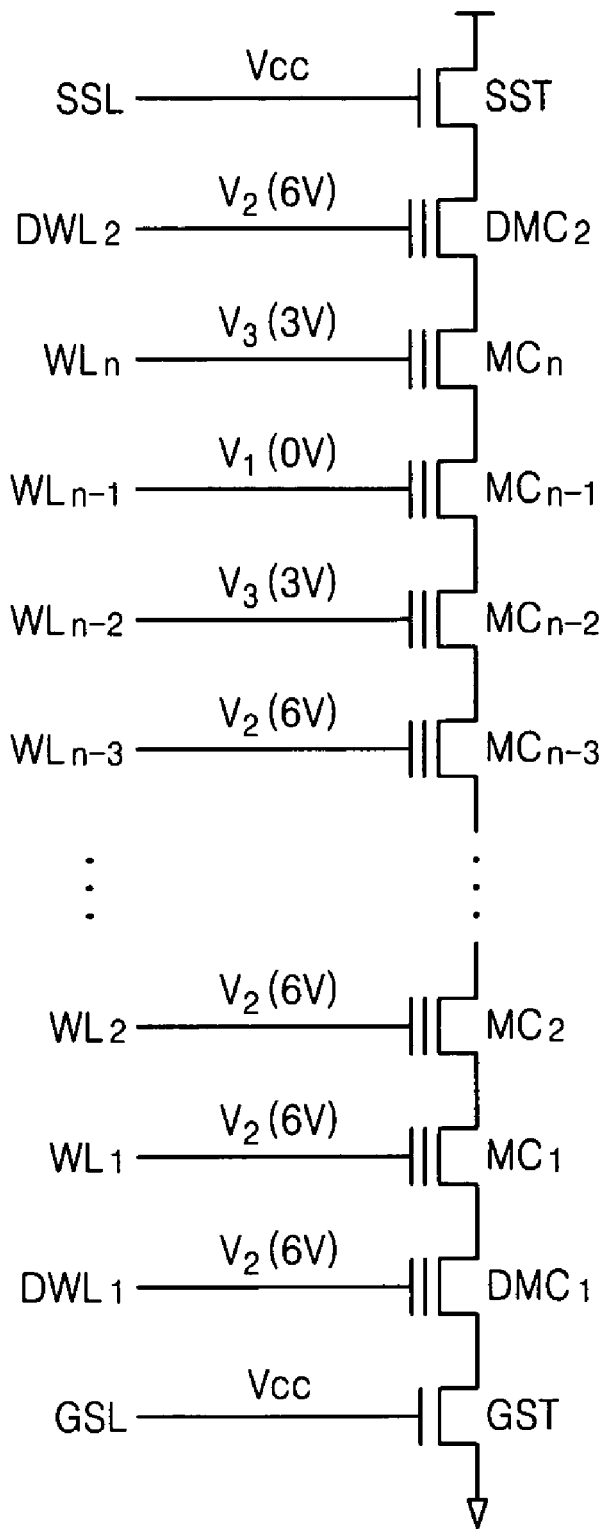

FIG. 6 illustrates supply of voltages to memory cells in a method of reading memory cell data according to example embodiments. Referring to FIG. 6, a nonvolatile memory device including first and second dummy memory cells DMC1 and DMC2 in addition to memory cells MC1 through MCn may be used. In the memory cells MC1 through MCn, data may be written. However, in the first and second dummy memory cells DMC1 and DMC2, data is not written. A method of reading memory cell data according to example embodiments applies the third voltage V3 to adjacent memory cells MCn-2 and MCn. The channel of memory cell MCn-2 may be affected by both the second voltage V2 applied to memory cell MCn-3 and the third voltage V3 applied to memory cell MCn-2, and thus memory cell MCn-2 may be turned on. The channel of memory cell MCn may be affected by both the second voltage V2 applied to the second dummy memory cell DMC2 and the third voltage V3 applied to memory cell MCn, and thus the memory cell MCn may be turned on. Therefore, both adjacent memory cells MCn-2 and MCn may be turned on using only the third voltage V3.

Figure 7:
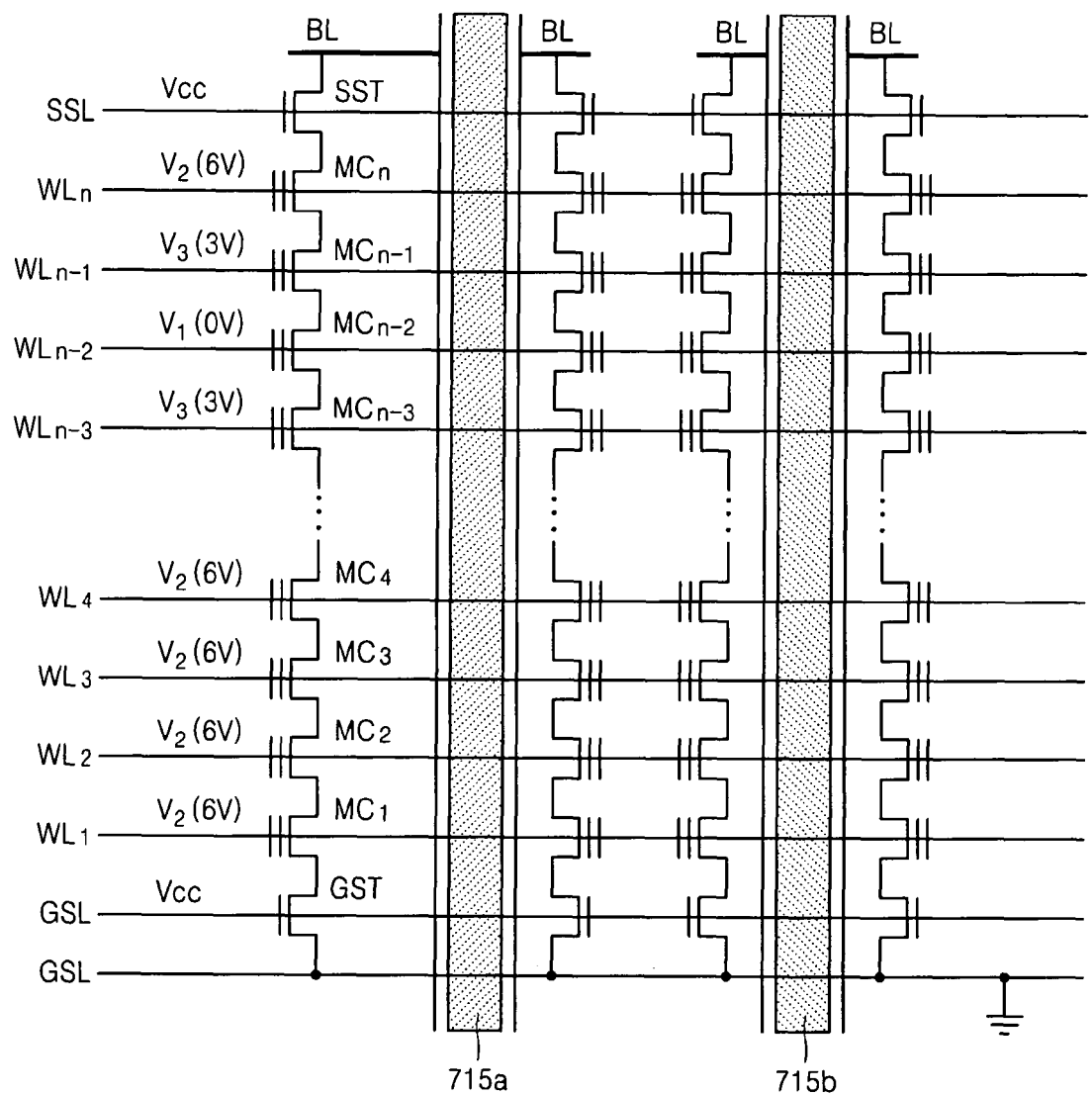

FIG. 7 illustrates a nonvolatile memory device having vertical channels to which the methods of reading memory cell data according to example embodiments may be applied. Memory cells MC1 through MCn of the nonvolatile memory device illustrated in FIG. 7 may have vertical channels (not shown). These vertical channels may be formed in predetermined regions of fins (not shown) of memory cells MC1 through MCn. The nonvolatile memory device illustrated in FIG. 7 may further include insulating layers 715a and 715b.

The foregoing may be illustrative of example embodiments and is not to be construed as limiting thereof. Although a few example embodiments have been described, those skilled in the art will readily appreciate that many modifications may be possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of reading memory cell data of a nonvolatile memory device including a plurality of memory cells each having a control gate and a charge storage layer, the method comprising:
    applying a first voltage to a control gate of a read memory cell from among the plurality of memory cells;
    applying a third voltage to control gates of memory cells adjacent to the read memory cell; and
    applying a second voltage to control gates of the other memory cells of the plurality of memory cells,
    wherein the second voltage is higher than or equal to a minimum voltage and makes current flow through the memory cells irrespective of states of the memory cells, and the third voltage is higher than the first voltage and lower than the second voltage.

2. The method of claim 1, wherein the third voltage is lower than the minimum voltage and makes current flow through the memory cells irrespective of states of the memory cells.

3. The method of claim 1, wherein the third voltage is lower than a voltage that changes a state of the read memory cell, and
    current flow through the adjacent memory cells is based on at least the applied second voltage and the third voltage.

4. The method of claim 1, wherein the third voltage is lower than a voltage that influences a channel of the read memory cell.

5. The method of claim 1, wherein the first voltage is higher than a threshold voltage of a memory cell in an erase state and lower than a threshold voltage of a memory cell in a programmed state, and
    the second voltage is higher than a threshold voltage of the memory cell in the programmed state.

6. The method of claim 1, wherein the second voltage is the lowest voltage generated by the nonvolatile memory device that allows current to flow in the memory cells.

7. The method of claim 1, wherein the second voltage is higher than a voltage of a highest threshold voltage distribution among a plurality of threshold voltage distributions of programmed memory cell.

8. The method of claim 7, wherein the second voltage is higher than the voltage of the highest threshold voltage by a determined voltage margin.

9. The method of claim 1, wherein the first voltage is a ground voltage.

10. The method of claim 1, wherein the plurality of memory cells are respectively connected to different wordlines and provided with at least one of the first voltage, the second voltage and the third voltage through the wordlines.

11. The method of claim 1, wherein the plurality of memory cells are connected to the same bit line.

12. The method of claim 1, wherein the plurality of memory cells are connected in a NAND flash memory array.

13. The method of claim 1, wherein the third voltage decreases as gate length of the memory cell control gates decrease.

14. The method of claim 1, further comprising:
    applying a fourth voltage to a memory cell adjacent to one side of the read memory cell,
    wherein the fourth voltage is higher than the third voltage and lower than the second voltage.

15. The method of claim 14, wherein the plurality of memory cells include first through nth memory cells connected in series, the fourth voltage is applied to the first memory cell or the nth memory cell adjacent to one side of the second memory cell or the (n-1)th memory cell and the third voltage is applied to the third memory cell or the (n-1)th memory cell adjacent to the other side of the second memory cell or the (n-1)th memory cell when the read memory cell is the second memory cell or the (n-1)th memory cell.

16. The method of claim 15, wherein the third voltage is applied to memory cells adjacent to the read memory cell when the read memory cell does not correspond to the second memory cell or the (n-1)th memory cell.

17. The method of claim 14, wherein the third voltage applied to the memory cell adjacent to one side of the read memory cell is lower than a voltage that changes the state of the read memory cell, and
    the fourth voltage applied to the memory cell adjacent to the other side of the read memory cell is lower than the voltage that changes the state of the read memory cell and higher than the third voltage.

18. The method of claim 14, wherein the third voltage and the fourth voltage are lower than a voltage that affects the channel of the read memory cell.

19. A nonvolatile memory device comprising:
    a first dummy memory cell and a second dummy memory cell to which data is not written;
    a plurality of memory cells connected in series between the first dummy memory cell and the second dummy memory cell;
    a ground select transistor connected to the first dummy memory cell; and
    a string select transistor connected to the second dummy memory cell
    wherein the non-volatile memory device is configured to apply a first voltage to a control gate of a read memory cell from among the plurality of memory cells, a third voltage to control gates of memory cells adjacent to the read memory cell, a second voltage to control gates of the other memory cells of the plurality of memory cells, the second voltage to control gates of the first and second dummy memory cells not adjacent to the read memory cell, and a fourth voltage to the control gates of the first and second dummy memory cells adjacent to the read memory cell, and
    the second voltage is higher than or equal to a minimum voltage and makes current flow through the memory cells irrespective of states of the memory cells, the third voltage is higher than the first voltage and lower than the second voltage, and the fourth voltage is higher than the third voltage and lower than the second voltage.

20. The nonvolatile memory device of claim 19, wherein the plurality of memory cells are respectively connected to different wordlines.

21. The nonvolatile memory device of claim 19, wherein the plurality of memory cells are connected to the same bit line.

* * * * *